(12) United States Patent
Kim et al.

(10) Patent No.: US 8,841,836 B2
(45) Date of Patent: Sep. 23, 2014

(54) FLAT PANEL DISPLAY DEVICE, ORGANIC LIGHT EMITTING DISPLAY DEVICE AND METHOD OF MANUFACTURING FLAT PANEL DISPLAY DEVICE

(71) Applicant: Samsung Display Co., Ltd., Yongin (KR)

(72) Inventors: Sang-Ho Kim, Yongin (KR); Jae-Woo Bae, Yongin (KR); Hun-Jung Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/677,123

(22) Filed: Nov. 14, 2012

(65) Prior Publication Data

US 2013/0285539 A1    Oct. 31, 2013

(30) Foreign Application Priority Data

Apr. 27, 2012 (KR) ......................... 10-2012-0044671

(51) Int. Cl.
| | |
|---|---|
| *H01L 51/52* | (2006.01) |
| *H05B 33/02* | (2006.01) |
| *G02B 5/30* | (2006.01) |
| *G02B 1/11* | (2006.01) |
| *H05B 33/12* | (2006.01) |

(52) U.S. Cl.
CPC .............. *H05B 33/12* (2013.01); *G02B 5/3025* (2013.01); *G02B 1/11* (2013.01); *G02B 1/118* (2013.01)
USPC .......................................... 313/504; 313/498

(58) Field of Classification Search
CPC . H01L 51/5012; H01L 51/5262; H01L 27/12; H01L 27/32; H01L 51/0096; H01L 33/26; H01L 33/42; H01L 33/40; H01L 27/1218
USPC .................................................. 313/498–512
See application file for complete search history.

(56) References Cited

U.S. PATENT DOCUMENTS

| | | | |
|---|---|---|---|
| 6,514,674 B1 * | 2/2003 | Iwasaki .......................... | 430/321 |
| 6,671,016 B1 | 12/2003 | Kim | |
| 2004/0155846 A1 * | 8/2004 | Hoffman et al. ................. | 345/87 |
| 2006/0175959 A1 * | 8/2006 | Choong et al. ................. | 313/504 |
| 2008/0042926 A1 * | 2/2008 | Egi et al. .......................... | 345/32 |
| 2009/0115321 A1 * | 5/2009 | Hayashi ........................ | 313/504 |
| 2010/0123384 A1 * | 5/2010 | Miller et al. ................... | 313/498 |
| 2011/0164210 A1 * | 7/2011 | Tsuda ............................. | 349/96 |
| 2012/0049206 A1 * | 3/2012 | Choi et al. ....................... | 257/88 |
| 2012/0126688 A1 * | 5/2012 | Richardson et al. ........... | 313/504 |

FOREIGN PATENT DOCUMENTS

| | | |
|---|---|---|
| JP | 2011-048000 A | 3/2011 |
| KR | 2001-0001104 A | 1/2001 |
| KR | 10-0754327 B1 | 8/2007 |
| KR | 10-2010-0104103 A | 9/2010 |
| WO | WO 2006125988 A1 * | 11/2006 .............. H01L 51/52 |

* cited by examiner

*Primary Examiner* — Donald Raleigh
(74) *Attorney, Agent, or Firm* — Knobbe, Martens, Olson & Bear, LLP (57) ABSTRACT

A flat panel display device includes a transparent display panel including a transparent area transmitting light incident on one surface of the transparent display panel to the other surface opposite to the one surface; a first anti-reflective film which is formed over the one surface of the transparent display panel and has a moth eye structure; and a second anti-reflective film which is formed over the other surface of the transparent display panel and has a moth eye structure.

17 Claims, 5 Drawing Sheets

FLAT PANEL DISPLAY DEVICE, ORGANIC LIGHT EMITTING DISPLAY DEVICE AND METHOD OF MANUFACTURING FLAT PANEL DISPLAY DEVICE

CROSS-REFERENCE TO RELATED PATENT APPLICATION

This application claims the benefit of Korean Patent Application No. 10-2012-0044671, filed on Apr. 27, 2012, in the Korean Intellectual Property Office, the disclosure of which is incorporated herein in its entirety by reference.

BACKGROUND

1. Field

The present disclosure relates to a flat panel display device, such as an organic light emitting display device, and a method of manufacturing the flat panel display device.

2. Discussion of the Related Technology

Recently, flat panel display devices that may be easily implemented in a large-area dimension, thin type, and light-weighted condition are rapidly and widely being used. Such flat panel display devices include liquid crystal displays (LCDs), plasma display panels (PDPs), or organic light emitting display devices (OLEDs).

Also, the flat panel display device may be implemented as a transparent display device including a transparent region in at least a portion of the flat panel display device.

SUMMARY

An aspect of the present invention provides a flat panel display device, such as an organic light emitting display device, and a method of manufacturing the flat panel display device, wherein the flat panel display device includes a transparent display panel having an improved bright room contrast and visibility by suppressing external light reflection.

One aspect of the present invention provides a flat panel display device including a transparent display panel which includes a transparent area configured to at least partly transmit light incident on one surface of the transparent display panel to the other surface opposite to the one surface; a first anti-reflective film which is formed over the one surface of the transparent display panel and has a moth eye structure; and a second anti-reflective film which is formed over the other surface of the transparent display panel and has a moth eye structure.

In the foregoing device, the first and second anti-reflective films may comprise a plurality of projections, each of which is in the form of a quadrangular pyramid or a circular cone.

The moth eye structure may include a plurality of projections that are respectively spaced at an interval equal to or less than the wavelength of a visible ray.

The flat panel display device may further include a first circular polarizer interposed between the transparent display panel and the first anti-reflective film.

The flat panel display device may further include a second circular polarizer interposed between the transparent display panel and the second anti-reflective film.

The flat panel display device may further include a first light-absorbing film, which is interposed between the transparent display panel and the first anti-reflective film and configured to absorb at least a portion of light having a wavelength within a range of about 350 nm to about 800 nm.

The flat panel display device may further include a second light-absorbing film, which is interposed between the transparent display panel and the second anti-reflective film and configured to absorb at least a portion of light having a wavelength within a range of about 350 nm to about 800 nm.

The first anti-reflective film may include a light-absorbing dye, which absorbs at least a part of light having a wavelength within a range of about 350 nm to about 800 nm.

The second anti-reflective film may include a light-absorbing dye, which is configured to absorb at least a part of light having a wavelength within a range of about 350 nm to about 800 nm.

Another aspect of the present invention provides an organic light emitting display device including a transparent display panel which includes a transparent area configured to at least partly transmit light incident on one surface of the transparent display panel to the other surface opposite to the one surface, and at least a pixel including a pixel electrode, an organic emission layer disposed over the pixel electrode, and a counter electrode disposed over the organic emission layer; a first anti-reflective film placed over the one surface of the transparent display panel and comprising a moth eye structure; and a second anti-reflective film placed on the other surface of the transparent display panel and comprising a moth eye structure.

Still another aspect of the present invention provides a method of manufacturing a flat panel display device. The method includes providing a transparent display panel including a transparent area, which is configured to at least partly transmit light incident on one surface of the transparent display panel to the other surface opposite to the one surface; forming a first anti-reflective film over the one surface of the transparent display panel, wherein the first anti-reflective film comprises a moth eye structure; and forming a second anti-reflective film over the other surface of the transparent display panel, wherein the second anti-reflective film comprises a moth eye structure.

In the foregoing method, the forming of the first and second anti-reflective films may include forming a plurality of projections of the first and second anti-reflective films, each of the plurality of projections being in the form of a quadrangular pyramid or a circular cone.

The forming of the first and second anti-reflective films may include forming the moth eye structure including a plurality of projections that are respectively spaced at an interval equal to or less than the wavelength of the visible ray.

The method may further include forming a first circular polarizer before the forming of the first anti-reflective film.

The method may further include forming a second circular polarizer before the forming of the second anti-reflective film.

The method may further include forming a first light-absorbing film configured to absorb at least a portion of light having a wavelength within a range of about 350 nm to about 800 nm before the forming of the first anti-reflective film.

The method may further include forming a second light-absorbing film configured to absorb at least a portion of light having a wavelength within a range of about 350 nm to about 800 nm before the forming of the second anti-reflective film.

The first anti-reflective film may include a light-absorbing dye, which is configured to absorb at least a part of light having a wavelength within a range of about 350 nm to about 800 nm.

The second anti-reflective film may include a light-absorbing dye, which is configured to absorb at least a part of light having a wavelength within a range of about 350 nm to about 800 nm.

BRIEF DESCRIPTION OF THE DRAWINGS

The above and other features and advantages of the present invention will become more apparent by describing in detail embodiments thereof with reference to the attached drawings in which.

DETAILED DESCRIPTION OF EMBODIMENTS

Hereinafter, embodiments of the present invention will be described in detail with reference to the accompanying drawings.

Generally, a circular polarizer or an anti-reflective (AR) film may be used in order to improve contrast and visibility by suppressing reflection of external light of the transparent display device.

However, since a substrate having a high reflectivity is used in the transparent display device, the reflectivity of the external light is high and reflection may occur on a surface where the external light is transmitted through a transparent panel as well as a surface in an incident direction of the external light. Thus, the reflection of the external light may not be sufficiently reduced.

Figure 1:
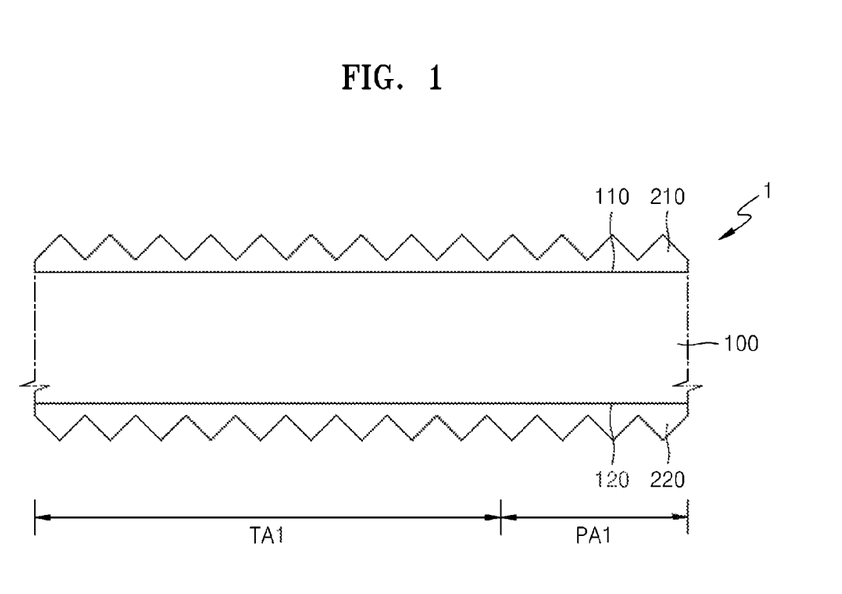
FIG. 1 is a cross-sectional view schematically illustrating a flat panel display device according to an embodiment of the present invention.
Figure 2:
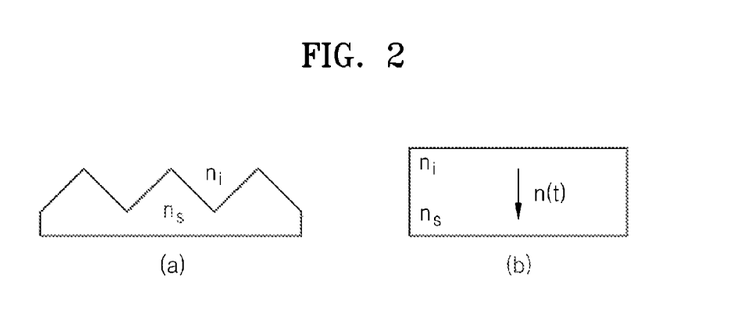
FIG. 2 shows views illustrating an example of a moth eye structure that is applied to an embodiment of the present invention.

FIG. 1 is a cross-sectional view schematically illustrating a flat panel display device 1 according to an embodiment of the present invention, and FIG. 2 shows views illustrating an example of a moth eye structure that is applied to an embodiment of the present invention.

Referring to FIG. 1, the flat panel display device 1 according to an embodiment includes a transparent display panel 100 including a transparent area TA1 that can transmit light incident on one surface 110 of the transparent display panel 100 to the other surface 120 opposite to the one surface 110, a first anti-reflective film 210 disposed on the one surface 110 of the transparent display panel 100 and having a moth eye structure, and a second anti-reflective film 220 disposed on the other surface 120 of the transparent display panel 100 and having a moth eye structure.

The transparent display panel 100 includes a transparent substrate (not shown), the transparent area TA1, and a pixel area PA1 for forming an image. In embodiment, the pixel area PA1 may include a pixel of an organic emission layer or a liquid crystal cell.

The flat panel display device 1 according to an embodiment of the present invention has the first and second anti-reflective films 210 and 220 that are respectively attached on the two surfaces 110 and 120 of the transparent display panel 100. In embodiments, each of the first and second anti-reflective films 210 and 220 has a moth eye structure.

In embodiment, the moth eye structure includes a plurality of projections that are respectively spaced at an interval equal to or less than the wavelength of a visible ray, and does not reflect light regardless of an incident angle or wavelength of light. The projections may be in the form of a quadrangular pyramid or a circular cone.

Generally, when light moves from one medium to another medium with different refractive index, Fresnel reflection occurs due to a refractive index difference between the two mediums.

Referring to the views (a) and (b) of FIG. 2, when a visible ray is incident on the moth eye structure having projections spaced at an interval d equal to or less than the wavelength of the visible ray having a refractive index $n_s$ greater than a refractive index $n_i$ of air or the like as shown in the view (a) of FIG. 2, the incident light acts in the same manner as that of the case that the light is incident on a medium having a continuously varying refractive index from $n_i$ to $n_s$ as shown in the view (b) of FIG. 2. That is, the moth eye structure shown in the view (a) of FIG. 2 may be considered as equivalent to the structure shown in the view (b) of FIG. 2.

Therefore, when external light is incident on the transparent display panel 100 through the first anti-reflective film 210 having a continuously varying refractive index, Fresnel reflection does not occur, and thus the external light reflection may be effectively suppressed.

Figure 3:
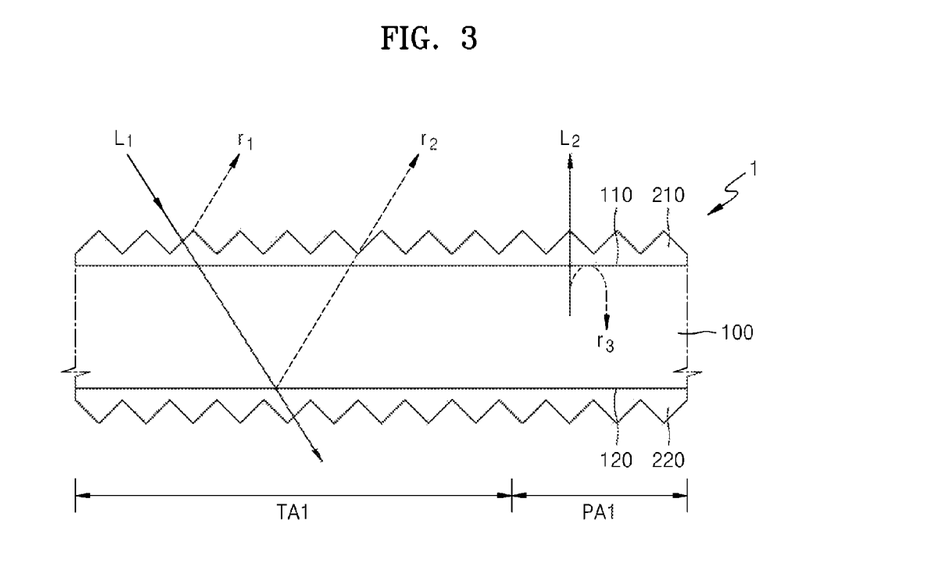
FIG. 3 is a conceptual view schematically illustrating pathways of external light incident on and reflected from the flat panel display device of FIG. 1.

FIG. 3 is a conceptual view schematically illustrating pathways of external light incident on the flat panel display device 1 of FIG. 1 and light emitted from the flat panel display device 1 of FIG. 1.

Referring to FIG. 3, when external light $L_1$ is incident from the outside on the transparent area TA1 of the flat panel display device 1, a part of the external light $L_1$ may be reflected from an interface between the first anti-reflective film 210 having the moth eye structure and the transparent display panel 100. In embodiments, a reflectivity is $r_1$. Also, the light that is not reflected therefrom but transmitted through the transparent display panel 100 may be partially reflected from an interface between the second anti-reflective film 220 having the moth eye structure and the transparent display panel 100 with a reflectivity of $r_2$.

That is, the whole reflectivity of the external light is about $r_1+r_2$ when $r_1$ is much smaller than transmittance of the external light $L_1$. In the illustrated embodiment, the anti-reflective films have the moth eye structure as described above, and the whole reflectivity is also very small, and thus the external light reflection may be effectively suppressed.

Moreover, when light $L_2$ emitted from pixels of the transparent display panel 100 is emitted to the outside, a part of the light $L_2$ is reflected from an interface between the transparent display panel 100 and the first anti-reflective film 210 with a reflectivity of $r_3$. However, the reflectivity $r_3$ has a very small value, and thus most of the light $L_2$ emitted from the pixels may be emitted without loss.

Since a bright room contrast ratio indicates a ratio of an intensity of light emitted from the pixels to an intensity of light due to the external light reflection, the bright room contrast ratio and visibility may be improved by attaching the first and second anti-reflective films 210 and 220 having a moth eye structure on the two opposite surfaces of the transparent display panel 100, respectively.

Figure 4:
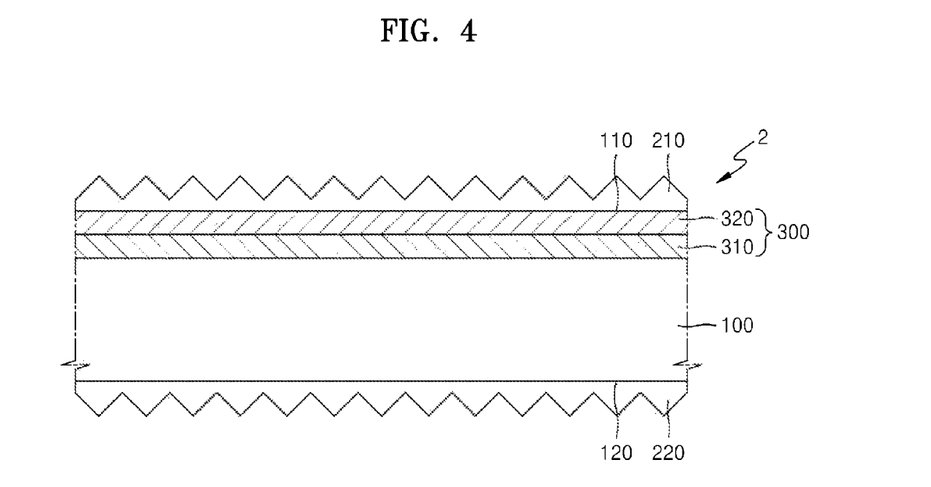
FIG. 4 is a cross-sectional view schematically illustrating a flat panel display device according to another embodiment of the present invention.

FIG. 4 is a cross-sectional view schematically illustrating a flat panel display device 2 according to another embodiment of the present invention.

Referring to FIG. 4, the flat panel display device 2 of FIG. 4 further includes a first circular polarizer 300 interposed between the transparent display panel 100 and the first anti-reflective film 210.

The first circular polarizer 300 may include a first quarter wave plate 310 and a first linear polarizer 320, but the present invention is not limited thereto.

In embodiments, the first circular polarizer 300 may be formed of a combination of the linear polarizer and the phase retardation plate that may convert the incident light to circularly polarized light. For example, the first circular polarizer 300 may have a structure of sequentially stacked a quarter wave plate, a half wave plate, and a linear polarizer.

When external light is incident on the pixel area PA1 of the transparent display panel 100, the circular polarizer 300 prevents the light from being reflected by a light-reflecting material such as a metal layer (not shown) included in the pixel area PA1 and from being emitted again to the outside.

In embodiments, when an optical axis of the first quarter wave plate 310 and an absorption axis of the first linear polarizer 320 are disposed to form an angle of about 45 degrees, the light incident from the outside becomes polarized in one direction due to the first linear polarizer 320, and is converted to circularly polarized light after passing the first quarter wave plate 310.

When the light converted to the circularly polarized light is reflected at the pixel area PA1, a phase of the light is shifted by about 90 degrees, and the light becomes polarized in one direction again after passing through the first quarter wave plate 310.

In embodiments, the light incident from the outside and linearly polarized by passing through the first linear polarizer 320 is perpendicular to the light reflected and linearly polarized by passing through the first quarter wave plate 310, and thus the reflected light may not transmit the first linear polarizer 320. Therefore, the light incident from the outside is prevented from being reflected and emitted to the outside again.

Figure 5:
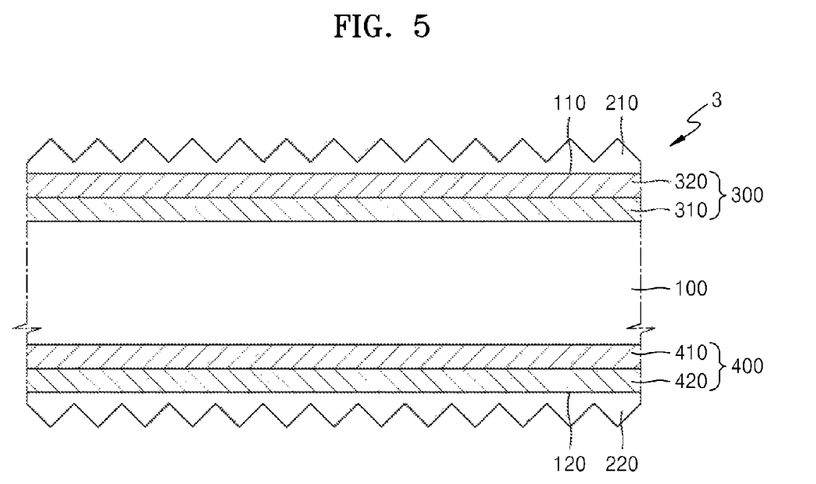
FIG. 5 is a cross-sectional view schematically illustrating a flat panel display device according to another embodiment of the present invention.

FIG. 5 is a cross-sectional view schematically illustrating a flat panel display device 3 according to another embodiment of the present invention.

Referring to FIG. 5, the flat panel display device 3 of FIG. 5 further includes a second circular polarizer 400 interposed between the transparent display panel 100 and the second anti-reflective film 220. The second circular polarizer 400 includes a second quarter wave plate 410 and a second linear polarizer 420.

When the two surfaces of the transparent display panel 100 emit light, the flat panel display device 3 in accordance with the illustrated embodiment may be more effective in suppressing external light reflection from the two surfaces of the transparent display panel 100.

Figure 6:
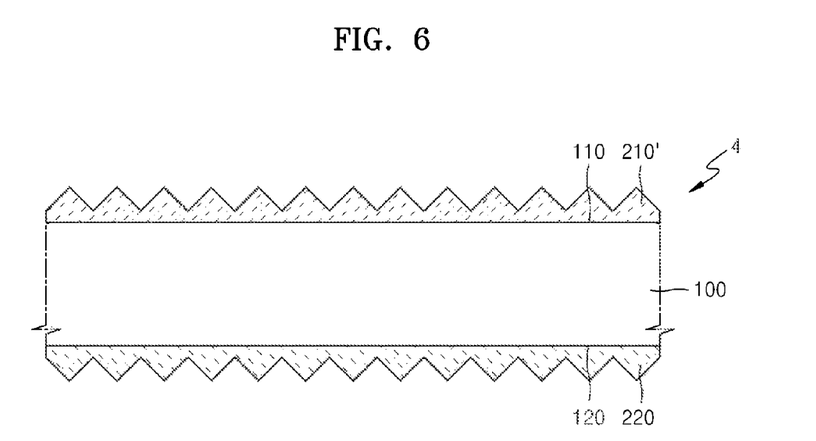
FIG. 6 is a cross-sectional view schematically illustrating a flat panel display device according to another embodiment of the present invention.

FIG. 6 is a cross-sectional view schematically illustrating a flat panel display device 4 according to another embodiment of the present invention.

Referring to FIG. 6, the flat panel display device 4 of FIG. 6 includes the transparent display panel 100, a first anti-reflective film 210', and a second anti-reflective film 220'. The first anti-reflective film 210' is disposed on the one surface 110 of the transparent display panel 100, has a moth eye structure, and contains a light-absorbing dye that absorbs at least a part of the light having a wavelength within a range of about 350 nm to about 800 nm. The second anti-reflective film 220' is disposed on the other surface 120 of the transparent display panel 100, has a moth eye structure, and contains a light-absorbing dye that absorbs at least a part of the light having a wavelength within a range of about 350 nm to about 800 nm.

In embodiments, the light-absorbing dye absorbs at least a part of the light having wavelengths corresponding to a band of visible ray. In embodiments, the light-absorbing dye may absorb a wavelength within a range of about 350 nm to about 800 nm in one embodiment. In another embodiment, the light-absorbing dye may absorb a wavelength within a range of about 380 nm to about 770 nm.

In embodiments, the light-absorbing dye may include red, green, or blue pigments.

Color impression of light that is reflected from or transmitted through the flat panel display device 4 may be controlled by providing the light-absorbing dye in the first and second anti-reflective films 210' and 220', and thus quality of an image realized by the flat panel display device 4 may be improved.

In embodiments, types and amount of the pigments may be appropriately combined depending on wavelength and quantity of light to be absorbed.

The light-absorbing dye is included in both of the first and second anti-reflective films 210' and 220' of the flat panel display device 4 of FIG. 6, but the present invention is not limited thereto, and the light-absorbing dye may be included in only one of the first and second anti-reflective films 210' and 220'.

Figure 7:
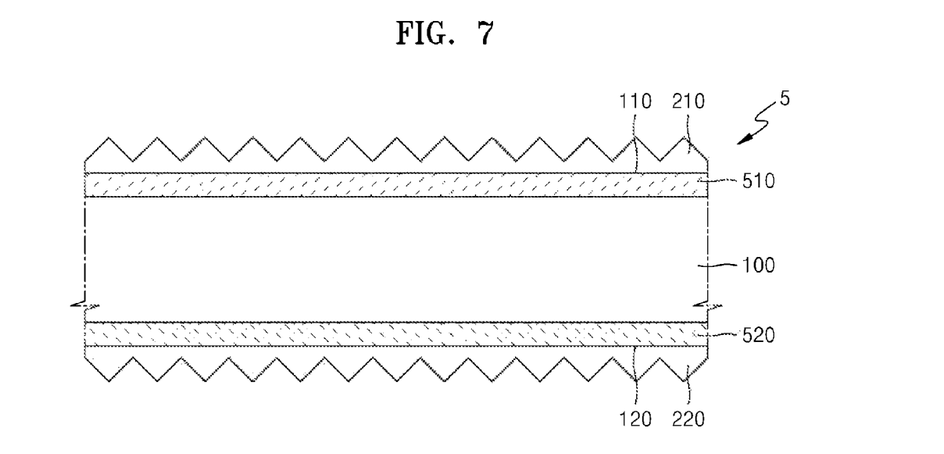
FIG. 7 is a cross-sectional view schematically illustrating a flat panel display device according to another embodiment of the present invention.

FIG. 7 is a cross-sectional view schematically illustrating a flat panel display device 5 according to another embodiment of the present invention.

Referring to FIG. 7, the flat panel display device 5 of FIG. 7 further includes a first light-absorbing film 510 and a second light-absorbing film 520. The first light absorbing film 510 is interposed between the transparent display panel 100 and the first anti-reflective film 210. The second light-absorbing film 520 is interposed between the transparent display panel 100 and the second anti-reflective film 220.

In embodiments, the first and second light-absorbing films 510 and 520 may absorb at least a part of the light having a wavelength within a range of about 350 nm to about 800 nm. The first and second light-absorbing films 510 and 520 are coated with or contain a light-absorbing material which includes the red, green, or blue pigments as described above.

In the flat panel display device 5 according to the current embodiment of the present invention, color impression of light that is reflected from or transmitted through the flat panel display device 5 may be controlled by controlling wavelength and quantity of light that is absorbed by the first and second light-absorbing films 510 and 520, and thus quality of an image realized by the flat panel display device 5 may be improved.

Figure 8:
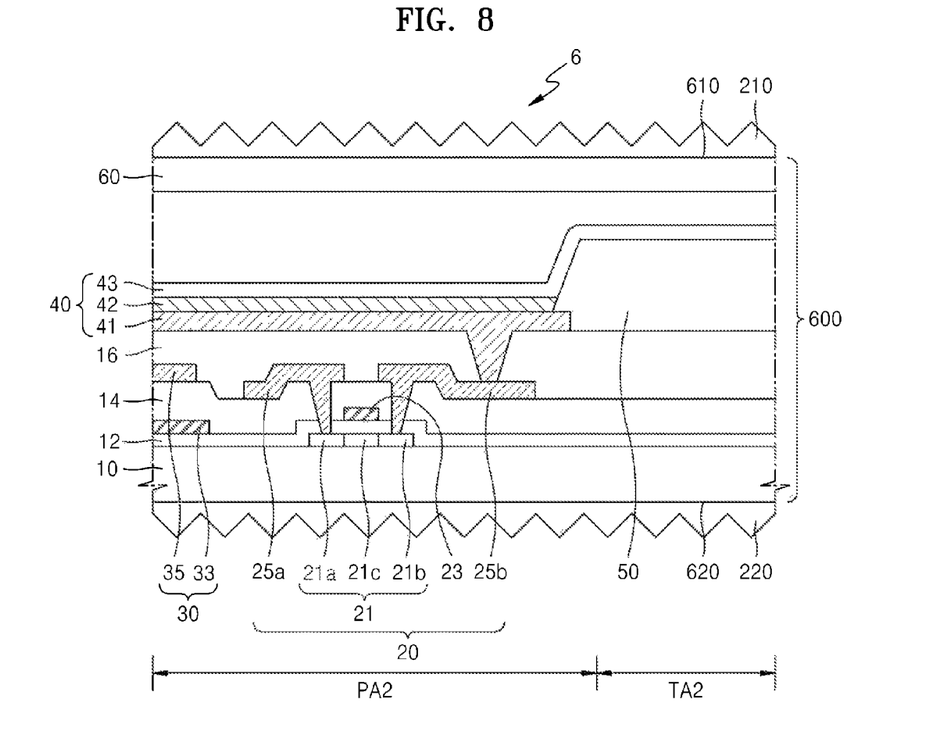
FIG. 8 is a cross-sectional view schematically illustrating an organic light emitting display device according to an embodiment of the present invention.

FIG. 8 is a cross-sectional view schematically illustrating an organic light emitting display device 6 according to an embodiment of the present invention.

Referring to FIG. 8, the organic light emitting display device 6 according to an embodiment of the present invention includes a transparent display panel 600 including a transparent area TA2 which can transmit light incident on one surface 610 to the other surface 620 opposite to the one surface 610, and a pixel area PA2 which includes a pixel including a pixel electrode 41, an organic emission layer 42 disposed on the pixel electrode 41, and a counter electrode 43 disposed on the organic emission layer 42; a first anti-reflective film 210 formed on the one surface of the transparent display panel 600 with a moth eye structure; and a second anti-reflective film 220 formed on the other surface of the transparent display panel 600 with a moth eye structure. In embodiments, the transparent area TA2 can be interposed between two neighboring pixel areas.

In embodiments, the transparent display panel 600 includes a thin film transistor 20, a capacitor 30, and an organic light emitting diode 40.

In one embodiment, the transparent display panel 600 includes a transparent substrate 10 formed of a transparent insulating substrate including glass, quartz, ceramic, or plastic. The thin film transistor 20 disposed on the transparent substrate 10 includes an active layer 21, a gate electrode 23, and source and drain electrodes 25*a* and 25*b*.

The active layer 21 may be formed of a semiconductor material such as amorphous silicon or polysilicon, but is not limited thereto, and may be formed of an oxide semiconductor. The active layer 21 may include a channel area 21*c* and source and drain areas 21*a* and 21*b* that are doped with ion impurities at outer sides of the channel area 21*c*.

The gate electrode 23 is disposed on the active layer 21, and a gate insulating layer 12 is interposed between the active layer 21 and the gate electrode 23. In embodiments, the gate electrode 23 may include one or more metals selected from Al, Pt, Pd, Ag, Mg, Au, Ni, Nd, Ir, Cr, Li, Ca, Mo, Ti, W, and Cu, and may be formed in a single layer or multi layers.

An interlayer insulating layer 14 is disposed on the gate electrode 23, and the source and drain electrodes 25*a* and 25*b*, which are respectively connected to the source and drain areas 21*a* and 21*b*, are disposed with the interlayer insulating layer 14 therebetween.

The source and drain electrodes 25*a* and 25*b* includes one or more metals selected from Al, Pt, Pd, Ag, Mg, Au, Ni, Nd, Ir, Cr, Li, Ca, Mo, Ti, W, and Cu, and may be formed in a single layer or multi layers.

A planarization layer 16 including via holes, which electrically connect the pixel electrode 41 and one of the source and drain electrodes 25*a* and 25*b*, is disposed on the source and drain electrodes 25*a* and 25*b*.

The capacitor 30 includes a lower electrode 33 formed of the same material with the gate electrode 23 and an upper electrode 35 formed of the same material with the source and drain electrodes 25*a* and 25*b*.

The organic light emitting diode 40 is disposed on the planarization layer 16, and the organic light emitting diode 40 includes the pixel electrode 41, the organic emission layer 42, and the counter electrode 43 that are sequentially disposed. In embodiments, a pixel defining layer 50 is disposed to cover an edge of the pixel electrode 41.

According to the current embodiment, the pixel electrode 41 may be an anode, and the counter electrode 43 may be a cathode. However, the present invention is not limited thereto, and the pixel electrode 41 may be a cathode, and the counter electrode 43 may be an anode.

The pixel electrode 41 included in the organic light emitting diode 40 according to the current embodiment may be a reflective electrode. The pixel electrode 41 may include a reflecting film formed of Ag, Mg, Al, Pt, Pd, Au, Ni, Nd, Ir, Cr, or a compound thereof, and a transparent or semitransparent electrode layer formed on the reflecting film.

The transparent or semitransparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The counter electrode 43 disposed opposite to the pixel electrode 41 may be a transparent electrode and may be formed of a metal thin layer with a small work function including Li, Ca, LiF/Ca, LiF/Al, Al, Ag, Mg, or a compound thereof. Also, an auxiliary electrode layer or a bus electrode as a material for forming the transparent electrode of ITO, IZO, ZnO, or $In_2O_3$ may be further formed on the metal thin layer.

Thus, in embodiments, the counter electrode 43 can transmit the light emitted from the organic light emission layer 42.

The organic emission layer 42 is interposed between the pixel electrode 41 and the counter electrode 43, and the organic emission layer 42 may be formed of a low molecular weight organic material or a high molecular weight organic material.

An interlayer such as a hole transport layer (HTL), a hole injection layer (HIL), an electron transport layer (ETL), or an electron injection layer (EIL) may be selectively interposed between the pixel electrode 41 and the counter electrode 43 as well as the organic emission layer 42.

The light emitted from the organic emission layer 42 may be a top emission type that is directly or reflected by the pixel electrode 41 constructed of the reflective electrode and emitted to the counter electrode 43.

The transparent display panel 600 according to embodiments includes the transparent area TA2 and the pixel area PA2. The gate electrode 23 and the source and drain electrodes 25*a* and 25*b* of the thin film transistor 20, the lower electrode 33 and the upper electrode 35 of the capacitor 30, and the pixel electrode 41 of the organic light emitting diode 40 are formed of a metal which may reflect the incident light.

In embodiments, the thin film transistor 20, the capacitor 30, and the organic light emitting diode 40 are formed in the pixel area PA2, and are not formed in the transparent area TA2. In some embodiments, the gate insulating layer 12, the interlayer insulating layer 14, the planarization layer 16, and the pixel defining layer 50 that are commonly disposed on the pixel area PA2 and the transparent area TA2 are all formed of a transparent insulating layer, and the counter electrode 43 that is formed as a common electrode may be made of a transparent material.

In embodiments, a ratio of an area of the transparent area TA2 to that of the entire transparent display panel 600 may be controlled or adjusted within a range from about 20 to about 90%.

The transparent display panel 600 may be sealed by a sealing substrate 60 to protect the organic light emitting diode 40, and the sealing substrate 60 may be a transparent substrate.

In embodiments, the first and second anti-reflective films 210 and 220 having a moth eye structure are disposed on the two surfaces 610 and 620 of the transparent display panel 600 of the organic light emitting display device 6, respectively. A structure and function of the first and second anti-reflective films 210 and 220 are same as described above.

Figure 9:
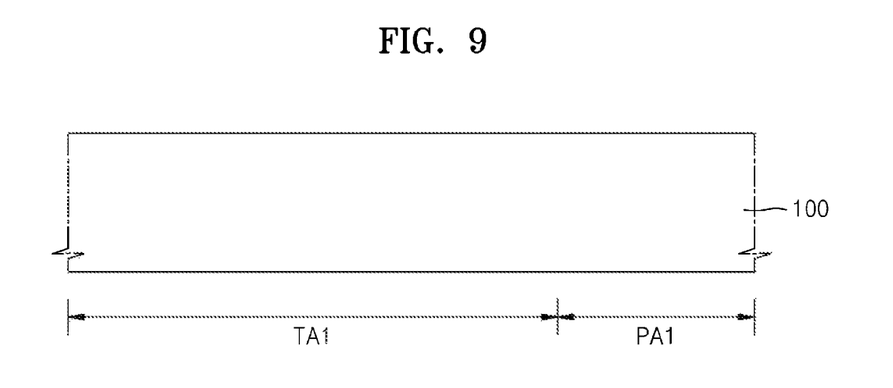
FIGS. 9 through 11 are cross-sectional views schematically illustrating a method of manufacturing the flat panel display device of FIG. 1 according to an embodiment of the present invention.
Figure 10:
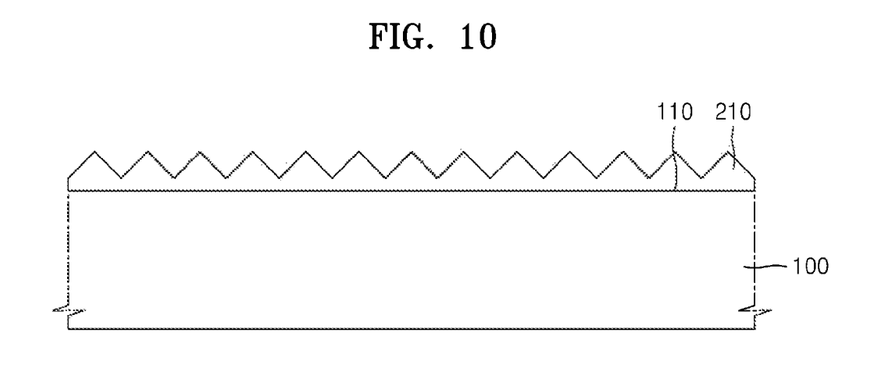
Figure 11:
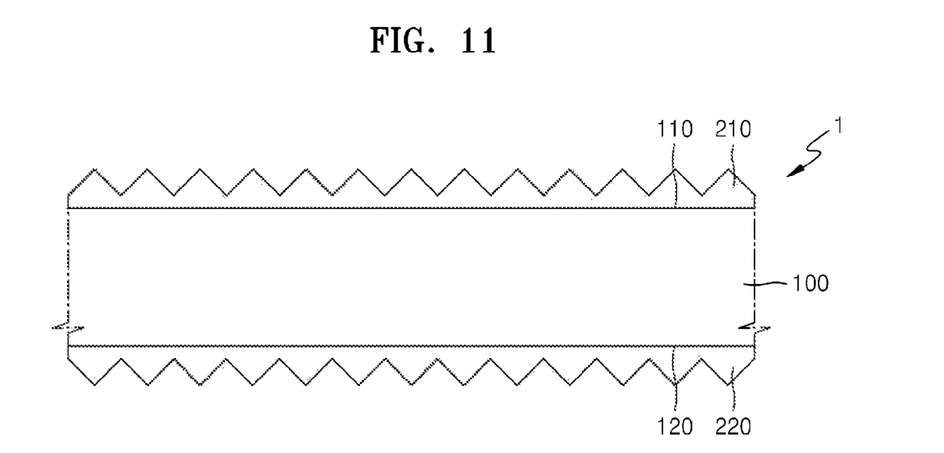

FIGS. 9 through 11 are cross-sectional views schematically illustrating a method of manufacturing the flat panel display device of FIG. 1

Referring to FIG. 9, in embodiments, the transparent display panel 100 including the transparent area TA1 is formed. The transparent display panel 100 includes the transparent area TA1 for transmitting light and the pixel area PA1 for forming an image, and the pixel area PA1 may include the organic emission layer or the liquid crystal cell.

Referring to FIG. 10, the first anti-reflective film 210 having a moth eye structure is disposed on the one surface 110 of the transparent display panel 100.

A moth eye structure includes a plurality of projections that are respectively spaced at an interval equal to or less than the wavelength of a visible ray, and does not reflect light regardless of an incident angle or wavelength of light. The projections may be in the form of a quadrangular pyramid or a circular cone.

Referring to FIG. 11, the second anti-reflective film 220 having a moth eye structure is disposed on the other surface 120 of the transparent display panel 200.

A detailed description of each of the elements is described above, and thus their description will be omitted for brevity.

As described above, the flat panel display device, the organic light emitting display device, and the method of manufacturing the flat panel display device according to the one or more of the above embodiments of the present invention may improve a bright room contrast and visibility by suppressing external light reflection by disposing the anti-reflective films with a moth eye structure on one or two surfaces of the transparent display panel of the flat panel display device.

Also, quality of an image formed by the flat panel display device may further be improved by providing the anti-reflective films including dye that absorbs light of a particular band of wavelengths or by additionally inserting a light absorbing film to the display panel.

Moreover, a luminance efficiency of the light may be increased.

The elements in the drawings may be described exaggerated or minimized for clarity, and thus the present invention is not limited to the size or shape of the elements in the drawings. While embodiments of the present invention have been particularly shown and described with reference to the drawings, it will be understood by those of ordinary skill in the art that various changes in form and details may be made therein without departing from the spirit and scope of the present invention as defined by the following claims.

What is claimed is:

1. A flat panel display device comprising:
a transparent display panel comprising a front transparent substrate, a back transparent substrate and a pixel array interposed between the front and back transparent substrates;
the pixel array comprising a plurality of pixels and a plurality of transparent areas, each transparent area having sufficient transparency to transmit visible light such that light beams incident on the front transparent substrate pass through one or more of the transparent areas of the pixel array and further pass through the back transparent substrate;
a first anti-reflective film which is formed over a surface of the front transparent substrate and comprises a moth eye structure;
a second anti-reflective film which is formed over a surface of the back transparent substrate and comprises a moth eye structure, wherein the second anti-reflective film is configured to inhibit reflection, back toward the front transparent substrate, of light beams that have passed through one or more of the transparent areas and reached the second anti-reflective film; and
a first light-absorbing film covering the transparent areas when viewed in a direction perpendicular to a major surface of the front transparent substrate, the first light-absorbing film being interposed between the transparent display panel and the first anti-reflective film, the first light-absorbing film being configured to absorb at least a portion of light having a wavelength within a range of about 350 nm to about 800 nm.

2. The flat panel display device of claim 1, wherein the first and second anti-reflective films comprise a plurality of projections, each of which is in the form of a quadrangular pyramid or a circular cone.

3. The flat panel display device of claim 1, wherein the moth eye structure comprises a plurality of projections that are respectively spaced at an interval equal to or less than the wavelength of a visible ray.

4. The flat panel display device of claim 1 further comprising a first circular polarizer interposed between the transparent display panel and the first anti-reflective film.

5. The flat panel display device of claim 1 further comprising a second circular polarizer interposed between the transparent display panel and the second anti-reflective film.

6. The flat panel display device of claim 1 further comprising a second light-absorbing film, which is interposed between the transparent display panel and the second anti-reflective film and configured to absorb at least a portion of light having a wavelength within a range of about 350 nm to about 800 nm.

7. The flat panel display device of claim 1, wherein the first anti-reflective film comprises a light-absorbing dye, which absorbs at least a part of light having a wavelength within a range of about 350 nm to about 800 nm.

8. The flat panel display device of claim 1, wherein the second anti-reflective film comprises a light-absorbing dye, which is configured to absorb at least a part of light having a wavelength within a range of about 350 nm to about 800 nm.

9. An organic light emitting display device comprising:
a transparent display panel comprising a front transparent substrate, a back transparent substrate and a pixel array interposed between the front and back transparent substrates;
the pixel array comprising a plurality of pixels and a plurality of transparent areas, at least one of the plurality of pixels comprising a pixel electrode, an organic emission layer disposed over the pixel electrode, and a counter electrode disposed over the organic emission layer, at least one of the plurality of transparent areas having sufficient transparency to transmit visible light such that light beams incident on the front transparent substrate pass through one or more of the transparent areas of the pixel array and further pass through the back transparent substrate;
a first anti-reflective film placed over a surface of the front transparent substrate and comprising a moth eye structure;
a second anti-reflective film placed over a surface of the back transparent substrate and comprising a moth eye structure, wherein the second anti-reflective film is configured to inhibit reflection, back toward the front transparent substrate, of light beams that have passed through one or more of the transparent areas and reached the second anti-reflective film; and
a first light-absorbing film covering the transparent areas when viewed in a direction perpendicular to a major surface of the front transparent substrate, the first light-absorbing film being interposed between the transparent display panel and the first anti-reflective film, the first light-absorbing film being configured to absorb at least a portion of light having a wavelength within a range of about 350 nm to about 800 nm.

10. A method of manufacturing a flat panel display device comprising:

providing a transparent display panel comprising a front transparent substrate, a back transparent substrate and a pixel array interposed between the front and back transparent substrates, the pixel array comprising a plurality of pixels and a plurality of transparent areas, each transparent area having sufficient transparency to transmit visible light such that light beams incident on the front transparent substrate pass through one or more of the transparent areas of the pixel array and further pass through the back transparent substrate;

forming, over the transparent areas when viewed in a direction perpendicular to a major surface of the front transparent substrate, a first light-absorbing film configured to absorb at least a portion of light having a wavelength within a range of about 350 nm to about 800 nm;

forming a first anti-reflective film over the first light-absorbing film, wherein the first anti-reflective film comprises a moth eye structure; and forming a second anti-reflective film over a surface of the back transparent substrate, wherein the second anti-reflective film comprises a moth eye structure.

11. The method of claim 10, wherein the forming of the first and second anti-reflective films comprises forming a plurality of projections of the first and second anti-reflective films, each of the plurality of projections being in the form of a quadrangular pyramid or a circular cone.

12. The method of claim 10, wherein the forming of the first and second anti-reflective films comprises forming the moth eye structure comprising a plurality of projections that are respectively spaced at an interval equal to or less than the wavelength of the visible ray.

13. The method of claim 10, wherein the method further comprises forming a first circular polarizer before the forming of the first anti-reflective film.

14. The method of claim 10, wherein the method further comprises forming a second circular polarizer before the forming of the second anti-reflective film.

15. The method of claim 10, wherein the method further comprises forming a second light-absorbing film configured to absorb at least a portion of light having a wavelength within a range of about 350 nm to about 800 nm before the forming of the second anti-reflective film.

16. The method of claim 10, wherein the first anti-reflective film comprises a light-absorbing dye, which is configured to absorb at least a part of light having a wavelength within a range of about 350 nm to about 800 nm.

17. The method of claim 10, wherein the second anti-reflective film comprises a light-absorbing dye, which is configured to absorb at least a part of light having a wavelength within a range of about 350 nm to about 800 nm.

* * * * *